(12) United States Patent
Van De Ruit et al.

(10) Patent No.: US 11,435,673 B2
(45) Date of Patent: Sep. 6, 2022

(54) METHOD OF DETERMINING A SET OF METROLOGY POINTS ON A SUBSTRATE, ASSOCIATED APPARATUS AND COMPUTER PROGRAM

(71) Applicant: ASML NETHERLANDS B.V., Veldhoven (NL)

(72) Inventors: Kevin Van De Ruit, Eindhoven (NL); Roy Werkman, Eindhoven (NL); Jochem Sebastiaan Wildenberg, Aarle-Rixtel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/440,251

(22) PCT Filed: Mar. 19, 2020

(86) PCT No.: PCT/EP2020/057617
§ 371 (c)(1),
(2) Date: Sep. 17, 2021

(87) PCT Pub. No.: WO2020/193367
PCT Pub. Date: Oct. 1, 2020

(65) Prior Publication Data
US 2022/0155698 A1 May 19, 2022

(30) Foreign Application Priority Data

Mar. 25, 2019 (EP) ..................... 19164831
Apr. 24, 2019 (EP) ..................... 19170764

(51) Int. Cl.
*G03F 9/00* (2006.01)
*G03F 7/20* (2006.01)

(52) U.S. Cl.
CPC .......... *G03F 9/7046* (2013.01); *G03F 7/7085* (2013.01); *G03F 7/70633* (2013.01)

(58) Field of Classification Search
CPC .. G03F 9/7046; G03F 7/70633; G03F 7/7085; G01N 21/47; G01N 21/956
See application file for complete search history.

(56) References Cited

U.S. PATENT DOCUMENTS

| | | |
|---|---|---|
| 9,811,006 B2 | 11/2017 | Wildenberg et al. |
| 2006/0190207 A1 | 8/2006 | Whitefield et al. |

(Continued)

FOREIGN PATENT DOCUMENTS

| | | | |
|---|---|---|---|
| CN | 109154781 | 1/2019 | |
| JP | 5813614 B2 * | 11/2015 | ............. G01B 11/27 |

(Continued)

OTHER PUBLICATIONS

International Search Report and Written Opinion issued in corresponding PCT Patent Application No. PCT/EP2020/057617, dated Jul. 8, 2020.

(Continued)

*Primary Examiner* — Peter B Kim
(74) *Attorney, Agent, or Firm* — Pillsbury Winthrop Shaw Pittman LLP (57) ABSTRACT

A method of determining a set of metrology point locations, the set including a subset of potential metrology point locations on a substrate, the method including: determining a relation between noise distributions associated with a plurality of the potential metrology point locations using existing knowledge; and using the determined relation and a model associated with the substrate to determine the set.

20 Claims, 3 Drawing Sheets

(56) References Cited

U.S. PATENT DOCUMENTS

| | | | |
|---|---|---|---|
| 2017/0160073 A1 | 6/2017 | Elings et al. |
| 2019/0086810 A1 | 3/2019 | Tel et al. |
| 2019/0137892 A1 | 5/2019 | Cekli et al. |

FOREIGN PATENT DOCUMENTS

| | | |
|---|---|---|
| TW | 201832020 | 9/2018 |
| WO | 2015110191 | 7/2015 |
| WO | 2018086795 | 5/2018 |

OTHER PUBLICATIONS

Taiwanese Office Action issued in corresponding Taiwanese Patent Application No. 109110076, dated Jan. 11, 2021.
Huang, C.Y. et al.: "Overlay Improvement by Zone Alignment Strategy", Proc. of SPIE, vol. 6922 (2008).

\* cited by examiner

METHOD OF DETERMINING A SET OF METROLOGY POINTS ON A SUBSTRATE, ASSOCIATED APPARATUS AND COMPUTER PROGRAM

CROSS-REFERENCE TO RELATED APPLICATIONS

This application is the U.S. national phase entry of PCT Patent Application No. PCT/EP2020/057617 which was filed on Mar. 19, 2020, which claims the benefit of priority of European Patent Application No. 19164831.0, which was filed on Mar. 25, 2019, and of European Patent Application No. 19170764.5, which was filed on Apr. 24, 2019, which are incorporated herein in their entireties by reference.

FIELD

The present invention relates to a method of determining a set of metrology points on a substrate, an associated apparatus and a computer program.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Whichever type of apparatus is employed, the accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. These operations, being time-consuming, limit the throughput of the lithography apparatus, and consequently increase the unit cost of the semiconductor or other products.

As pattern features become smaller and overlay performance requirements become ever more demanding, so-called advanced alignment models have been and continue to be developed to model and correct more accurately non-linear distortions of the "wafer grid". These advanced models depend on measuring an increased number of targets across the substrate. Ultimately, however only a limited number of the available targets can be measured without unduly limiting the throughput of the lithographic process as a whole.

These problems have been addressed by sampling scheme optimization methods, which select a subset of the total number of potential targets (or metrology point locations) on a substrate for use in alignment.

However, in such methods, there is an implicit assumption that the magnitude of the measurement variation is equal and uncorrelated across the substrate or within the field/image area. This is not the case in real systems. For example, the scanner behavior will correlate within the slit and the variation can change across the substrate (e.g. increasing at the edges). This causes the sampling schemes to be sub-optimal.

SUMMARY

It is therefore desirable to increase the reliability of said alignment models, or other metrology processes, without decreasing throughput by taking account of known aspects of the variations and correlations between variations. This may allow the effect of changes in the variation and/or correlations in the variation to be taken into account in the sampling scheme so that their effect on the alignment is reduced.

In one aspect, the invention provides a method of determining a set of metrology point locations, said set comprising a subset of potential metrology point locations on a substrate; wherein said method comprises: determining a relation between noise distributions associated with a plurality of said potential metrology point locations using existing knowledge; and using the determined relation and a model associated with said substrate to determine the set.

In another aspect, the invention provides a method of determining a model for fitting measurements, the model comprising a plurality of pre-determined base functions and coefficients associated with each of those base functions, the method comprising the steps of: determining a relation between noise distributions associated with a plurality of measurement positions using existing knowledge; and using the determined relation and calculated values of each base function at the measurement positions to determine the coefficients.

In further aspects, the invention provides a computer program comprising computer readable instructions which, when run on suitable computer apparatus, cause the computer apparatus to perform the method of the above aspect; a computer program product comprising such a computer program; and an apparatus having a processor specifically adapted to carry out the steps of the method of the above aspect.

These and other features and advantages of particular embodiments of the invention will be understood by the skilled reader from a consideration of the exemplary embodiments discussed below.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Figure 1:
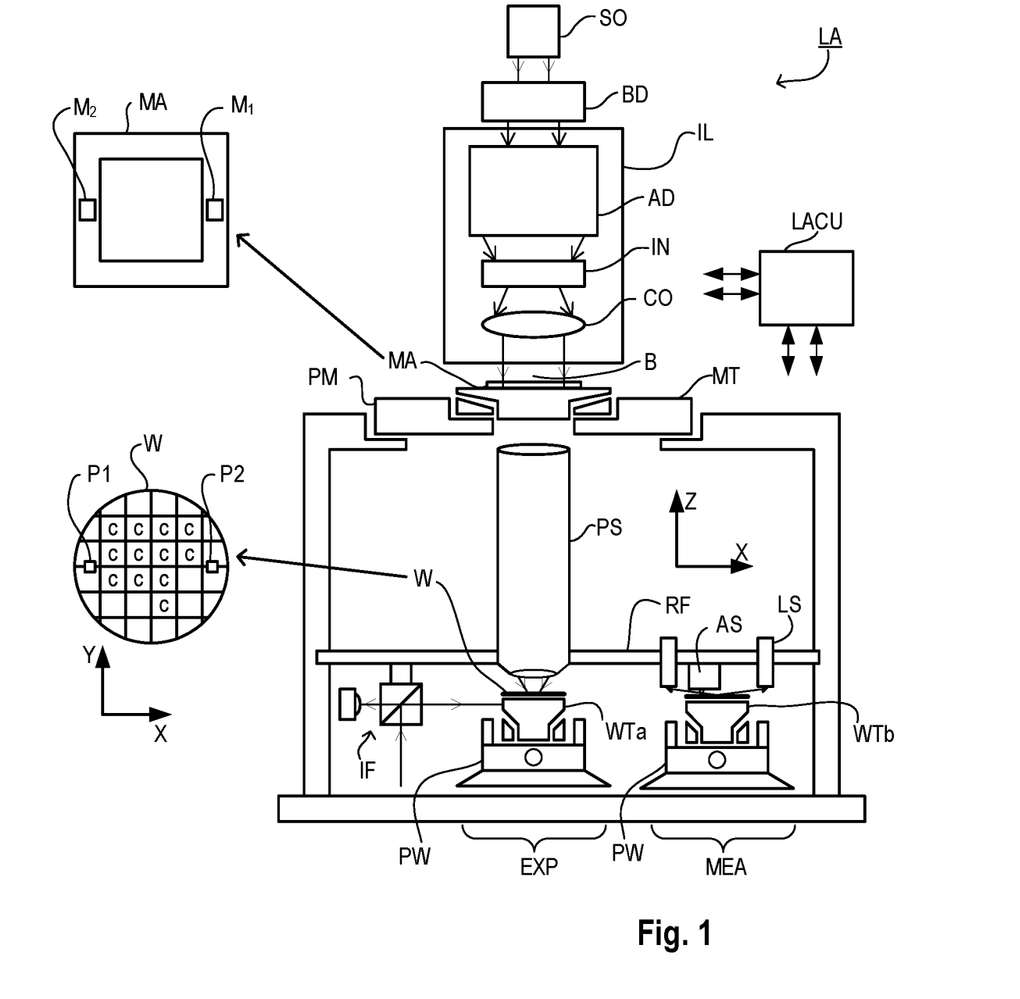
FIG. 1 depicts a lithographic apparatus according to an embodiment of the invention.

FIG. 1 schematically depicts a lithographic apparatus LA according to one embodiment of the invention. The apparatus comprises:
- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa or WTb constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface of the substrate using a level sensor LS and measuring the position of alignment mark on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. The invention can be applied in apparatus with only one substrate table, or with more than two.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
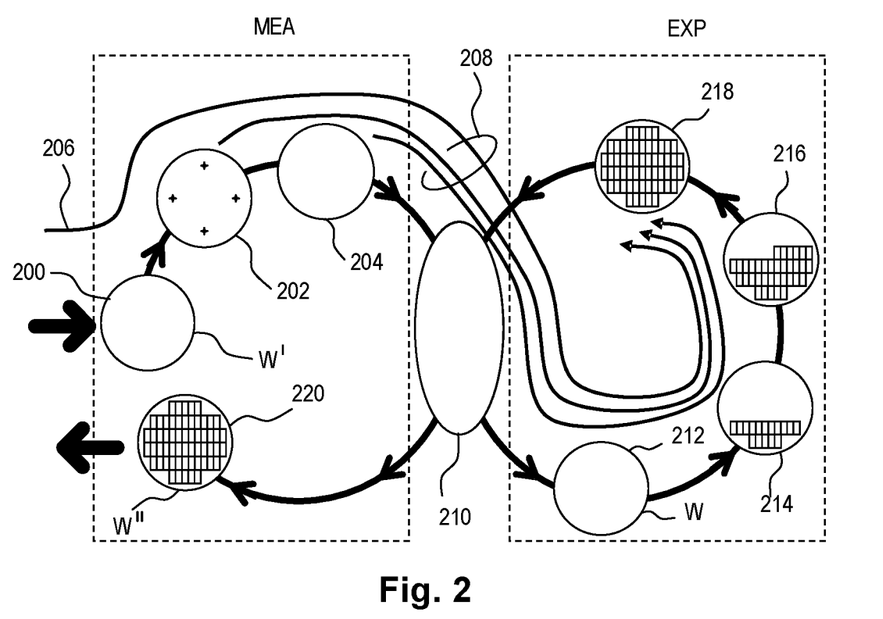
FIG. 2 illustrates schematically the stages in the measurement and exposure processes in the apparatus of FIG. 1, according to known practice.

FIG. 2 illustrates the known steps to expose target portions (e.g. dies) on a substrate W in the dual stage apparatus of FIG. 1. On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus. Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

At 202, alignment measurements using the substrate marks P1 etc. and image sensors (not shown) are used to measure and record alignment of the substrate relative to substrate table WTa/WTb. In addition, several alignment marks across the substrate W' will be measured, to establish a "wafer grid", which maps very accurately the distribution of marks across the substrate, including any distortion relative to a nominal rectangular grid. At step 204, a map of substrate height against X-Y position is measured also, for use in accurate focusing of the exposed pattern.

When substrate W' was loaded, recipe data 206 were received, defining the exposures to be performed, and also properties of the substrate and the patterns previously made and to be made upon it. To these recipe data are added the measurements of substrate position, substrate grid and height map that were made at 202, 204, so that a complete set of recipe and measurement data 208 can be passed to the exposure stage. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further below, advanced models are known that use more parameters.

At 210, substrates W' and W are swapped, so that the measured substrate W' becomes the substrate W entering the exposure station EXP. This swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) is all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns. By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Current standard alignment models may comprise six parameters (effectively three per direction X and three per direction Y). This may be adequate for some applications, but for more demanding processes a more detailed correction of the wafer grid may be required to achieve a desired overlay performance. Advanced alignment models have been developed for this purpose. In this text, the term "advanced alignment models" is used to refer to models having greater complexity than the standard six parameters. While simpler models might use fewer than ten parameters, advanced alignment models typically use more than 15 parameters, or more than 30 parameters. Examples of advanced models are higher order wafer alignment (HOWA) models, zone-alignment (ZA) and radial basis function (RBF) based alignment models. HOWA is a published technique based on third and higher order polynomial functions. Zone alignment is described for example in Huang et al, "Overlay improvement by zone alignment strategy", Proc. SPIE 6922, 69221G (2008). Different versions and extensions of these advanced models can be devised. The advanced models generate a complex description of the wafer grid that is corrected for, during the exposure of the target layer. RBF and latest versions of HOWA provide particularly complex descriptions based on tens of parameters. This implies a great many measurements are required to obtain a wafer grid with sufficient detail.

Even in embodiments with multiple substrate tables WTa/WTb, the time taken to obtain sufficient measurements for advanced alignment on each substrate eventually impacts throughput. Reducing the time per measurement tends to decrease the accuracy of each measurement, so that the impact on throughput is hard to avoid. In addition, once corrections have been applied in one layer using an advanced alignment model, the same level of detail should be applied in subsequent layers, or the corrections in the first layer become a source of error in the overlay of subsequent layers. The manufacturer therefore has a difficult choice whether to accept further measurement overhead by using the advanced model in subsequent layers, or to suffer an overlay penalty by reverting to a simpler alignment model in subsequent layers, measuring fewer marks.

There is a large degree of similarity in the problems faced for alignment and model estimation/correction calculation. The commonality is that a certain systematic pattern is estimated using a limited set of measurements taken at certain locations. The positions from which measurements are selected for inclusion in the estimation process, determines how reliable the resulting model is. This is because not all measurement positions are necessarily equally informative for the estimation procedure.

Current customer high volume manufacturing (HVM) measurement schemes typically sample four to eight fields on the substrate densely while covering the rest of the substrate in a sparse fashion (e.g. one metrology point per field). This is already suboptimal for the models currently in use, and more serious problems begin to occur for higher order models.

In a lithographic apparatus such as shown in FIG. 1, alignment is performed for each substrate prior to exposure. Multiple metrology points (e.g., alignment marks) are used to capture the shape of the substrate and to average out placement noise (e.g., originating from the lithographic apparatus baseline). Typically a subset of metrology point locations are selected for sampling from a number of possible metrology point locations on a substrate, the subset of metrology point locations comprising far fewer locations compared to the number of possible metrology point locations. Current algorithms for alignment determine which metrology point locations are selected for sampling based on covering the substrate in a uniform fashion, uniformity being defined as being equal or approximately equal distances between neighboring metrology points.

Various methods exist for determining the metrology point locations on the substrate which are selected for the sampling process. One such method is set out in U.S. Pat. No. 9,811,006B2, in which a range of potential metrology points are evaluated and selected using a measurement scheme optimization algorithm.

A criterion used in the evaluation of whether a metrology point location should be selected for inclusion in the sampling process may be D-optimality. In D-optimal designs, the determinant of the information matrix is maximized (and hence the determinant of the variance covariance matrix is minimized). An example for illustration is provided below.

Assuming a linear model, that is a model which is linear in its parameters, the following equation can be written:

$$\begin{bmatrix} m_1 \\ m_2 \\ \vdots \\ m_n \end{bmatrix} = \begin{bmatrix} C_{11} & C_{12} & \ldots & C_{1q} \\ C_{21} & C_{22} & \ldots & C_{2q} \\ \vdots & \vdots & \ddots & \vdots \\ C_{n1} & C_{n2} & \ldots & C_{nq} \end{bmatrix} \cdot \begin{bmatrix} p_1 \\ p_2 \\ \vdots \\ p_q \end{bmatrix} + \begin{bmatrix} \xi_1 \\ \xi_2 \\ \vdots \\ \xi_n \end{bmatrix}$$

Measurements are denoted by m, parameters by p, residuals by $\xi$, and the so-called design matrix by C. This design matrix forms the heart of the model, and it is comprised of the basis functions evaluated at selected metrology locations where the respective measurements were taken. Using for example a one dimensional polynomial model in x of orders zero through four, the basis functions would simply be; 1, x, $x^2$, $x^3$ and $x^4$ respectively. Therefore, if a measurement were to be available for location x=3, not taking into account normalization, the corresponding row in C would be: [1 3 9 27 81].

The modeling process may then proceed as follows:
1. measurements at selected metrology point locations are (made) available;
2. a suitable model form (i.e. a set of basis functions) is chosen so as to capture the relevant information underlying the data;
3. a minimization is performed yielding parameter values which minimize the distance in some mathematical norm between the model and the measurement data, this minimization may take the form of a least squares modeling.

Keeping the same notation as in the above, the optimization problem solved in least squares estimation is as follows:

$$\min_p \|m - C \cdot p\|_2^2 = \min_p (p^T \cdot C^T \cdot C \cdot p - 2 \cdot p^T \cdot C^T \cdot m) = \min_p \rho(p) \quad \text{Eq (1)}$$

Which in turn can be solved as follows:

$$\frac{\partial \rho}{\partial p^T} = 2 \cdot C^T \cdot C \cdot p - 2 \cdot C^T \cdot m \equiv 0 \rightarrow C^T \cdot C \cdot p = \quad \text{Eq (2)}$$

-continued
$$C^T \cdot m \rightarrow p = [C^T \cdot C]^{-1} \cdot C^T \cdot m$$

$C^T C$ is the information matrix, and its inverse $[C^T C]^{-1}$ is the variance-covariance matrix. The information matrix and variance-covariance matrix both indicate how informative the measurement scheme (i.e. the experiment) is for the chosen model; i.e., how well the measurement scheme will allow differentiation of the parameters (it should be noted that actual measurement values are not used for this). So, minimizing the determinant of the variance-covariance matrix or maximizing the determinant of the information matrix will yield the same result.

The D-optimality approach is targeted to minimize the volume of uncertainty associated with the coefficient of the model that the user wants to apply to fit the measurement results. Therefore a sampling scheme optimization approach using D-optimality provides a sampling scheme optimal for a particular pre-defined model. However, this assumes that the metrology point locations are mutually uncorrelated.

When it is known that the metrology point locations are not statistically uncorrelated and/or the variance of the noise is not uniform, the covariance matrix expressing the mutual correlation is not an identity matrix and it is therefore not the regular design matrix that needs to be taken into account when choosing the sampling scheme.

Accordingly, rather than considering the information matrix $C^T C$ (or the variance-covariance matrix $[C^T C]^{-1}$), the sampling scheme optimization approach of an embodiment of the present invention seeks to minimize the determinant of the matrix M defined as follows:

$$M = (C_T \cdot \Sigma^{-1} \cdot C)^{-1}$$

wherein $\Sigma$ is a co-variance matrix which incorporates knowledge of the variation behavior and correlation. The covariance matrix is constructed using knowledge of the variation behavior which may be obtained from one or more of a range of sources such as dense on-product measurements or scanner measurement data.

Using such knowledge improves the sampling scheme optimization by allowing it to put more weight (i.e. extra target density) in areas which show stronger variation, such as the edge of the substrate. It can also improve the sampling scheme optimization by taking account of repetitive features, such as the scanner behavior correlating within the slit.

A covariance matrix which takes account of correlation such as that used in the embodiments above can be constructed in a variety of ways, depending on the knowledge of the correlation available.

One method of constructing the covariance matrix is to use the maximum likelihood estimator for the covariance matrix, $\Sigma$. Let $X \in M^{n \times p}$ be the matrix with the measurement data, were the first index runs over all measurements for a single substrate, a total of n measurements, and the second index p over all the measured substrates. Now it is possible to estimate $\Sigma$ by $$S = \frac{1}{p-1}(X - \overline{X}) \cdot (X - \overline{X})^T.$$

Unfortunately, in order to get a good estimate, this would require p>>n, which is typically not feasible at the consumer level.

Therefore, it is preferable to incorporate domain knowledge into the construction of the covariance matrix. Again, this can be done in several ways.

One approach, according to an embodiment of the present invention, is to perform a cascade subspace approach as set out below.

First the average field per substrate is calculated, and this average field is mapped to the full layout, giving $X_{avgf}$. From this the maximum likelihood covariance estimator: $S_{avgf} \in M^{n \times n}$ can be calculated for the average field using the method set out above. This describes the average field effects, such as reticle align errors.

On the residual, i.e. $X-X_{avgf}$ (all substrates with their average field removed), we can now project to a typical inter-field model set, HOWA3 e.g., giving $X_{inter} \in M^{n \times p}$ and its maximum likelihood covariance estimator: $S_{inter}$. This describes the inter-field effects, such as substrate alignment errors.

On the further residual of that, i.e. $X_{res}:=X-X_{avgf}-X_{inter}$, it is then possible to 'stack the fields', that is reshape the matrix such that the each columns represent an exposure field, $$X_{res,stacked} \in M^{q \times (p \cdot \frac{n}{q})},$$

where q is the number of marks per field, giving an estimate $S_{stacked} \in M^{q \times q}$. We can now create $S_{F2F} \in M^{n \times n}$ as a block-diagonal matrix of $S_{stacked}$ matrices. This describes the field-to-field effects, such as stage positioning errors when moving the lens from one field to the next.

The total estimate $S=S_{avgf}+S_{stacked}+S_{F2F}$ should give a good estimate with a more limited amount of substrates p>>q, p>>r, where r is the number of inter-field parameters used.

The above model uses domain knowledge to reduce the effective degrees of freedom from which S can be estimated. The domain knowledge used is the assumption that the average field effect, inter-field effects and field-to-field effects cover most of the known contributors to overlay and that each have distinct root causes such that the cross-covariances between each of these subspaces is small. Depending on further knowledge about the presence or absence of these effects in the data, it may be possible to perform any one or two of the steps in the above model to obtain a useful estimate of S.

In general this approach can be generalized to the concept that domain knowledge gives us a mapping $\vec{s} \rightarrow S$, where $\vec{s}$ is a vector with a length significantly smaller than $n^2$. With this mapping $\hat{s}$ and therefore S can be found using a maximum likelihood estimate.

An alternative approach is to use some a priori statistical knowledge on the distribution of S. Instead of completely restricting S to some subspace, this would more gradually suppress unlikely outcomes of the estimates. One example of such an approach is the graphical lasso, which reduces the 1-norm of S; this is not base-independent, so domain knowledge is required to find a suitable base.

Alternatively, the covariance matrix could be determined without reliance on any customer measurements, for example based entirely on a priori knowledge of noise contributions in the machine.

As well as being used in the sampling scheme optimization embodiment described above, the covariance matrix (whether determined by one of the above approaches or otherwise) can also be used in a fitting process for estimating overlay error as set out in the embodiment below.

Having determined the covariance matrix, it is then applied to the design matrix. In order to estimate parameters based on a design matrix C without taking into account covariance the most likelihood estimate would be used: $\vec{p}=(C^T \cdot C)^{-1} \cdot C \cdot \vec{x}$, where: $\vec{p}$ is a vector containing the determined parameter values and $\vec{x}$ are the overlay results for a substrate.

To include the covariance matrix, the maximum likelihood estimator of $\vec{p}$ can be calculated as: $\vec{p}=(C^T \cdot \Sigma^{-1} \cdot C)^{-1} \cdot C \cdot \Sigma^{-1} \cdot \vec{x}$.

It should be appreciated that while the above description is couched in terms of overlay and alignment, it is not so restricted. The methods disclosed herein can be used in metrology of any type of feature which can be measured/modeled (e.g., Critical Dimension, Focus, Side Wall Angle, etc.). The more expensive the metrology, the greater the added value of an intelligent measurement scheme of reduced size.

Further embodiments of the invention are disclosed in the list of numbered clauses below:

1. A method of determining a set of metrology point locations, said set comprising a subset of potential metrology point locations on a substrate; wherein said method comprises:
determining a relation between noise distributions associated with a plurality of said potential metrology point locations using existing knowledge; and using the determined relation and a model associated with said substrate to determine the set.

2. A method according to clause 1 wherein the relation describes the covariance between each of said plurality of potential metrology point locations.

3. A method according to clause 1 or 2, wherein the relation includes the relative magnitude of variances associated with said noise distributions.

4. A method according to clause 2, wherein the relation has the shape of a covariance matrix and the method further comprises, for each of the potential metrology point locations, minimizing the determinant of a matrix which is formed from: a design matrix describing said model with the potential metrology point location; and the covariance matrix.

5. A method according to any one of the preceding clauses, wherein the metrology point locations contained in the set are the metrology point locations which contribute the greatest level of informativity about the substrate for a pre-determined size of the set.

6. A method according to any one of the preceding clauses, further comprising the step of performing a metrology operation on said substrate using measurements obtained exclusively from metrology points located at said set of metrology point locations.

7. A method according to any one of clauses 1 to 5, further comprising the step of performing an alignment operation on said substrate using measurements obtained exclusively from metrology points located at said set of metrology point locations, during a lithographic process.

8. A method according to claim 7, further comprising the step of performing a patterning operation on said substrate after performing said alignment operation.

9. A method according to any one of clauses 1 to 5, further comprising the step of modelling distortions in a lithographic process using measurements obtained exclusively from metrology points located at said set of metrology point locations.

10. A method of determining a model for fitting measurements, the model comprising a plurality of pre-determined base functions and coefficients associated with each of those base functions, the method comprising the steps of:

determining a relation between noise distributions associated with a plurality of measurement positions using existing knowledge; and using the determined relation and calculated values of each base function at the measurement positions to determine the coefficients.

11. A method according to clause 10 wherein the relation describes the covariance between each of said plurality of measurement positions.

12. A method according to clause 10 or 11, wherein the relation includes the relative magnitude of variances associated with said noise distributions.

13. A method according to any one of clauses 10 to 12, wherein the step of determining the coefficients uses a least squares approach.

14. A method according to any one of clauses 10 to 12, wherein the step of determining the coefficients includes calculating a maximum likelihood estimator of a vector comprising the coefficients.

15. A method according to any one of the preceding clauses, wherein the existing knowledge includes previous measurements of noise data associated with the metrology point locations.

16. A method according to any one of the preceding clauses wherein the existing knowledge includes assumptions about the inter-relation between a plurality of factors which affect variation between the metrology point locations.

17. A method according to any one of the preceding clauses wherein, when determining the covariance measurement, the existing knowledge is used to reduce the degrees of freedom from which the covariance measurement can be determined.

18. A method according to any one of the preceding clauses, as applied in or to a lithographic process, wherein the relation is determined by calculating the average field per substrate from which measurement data is obtained.

19. A method according to any one of the preceding clauses, as applied in or to a lithographic process, wherein the relation is determined by calculating the inter-field effects between the fields on substrates from which measurement data is obtained.

20. A method according to any one of the preceding clauses, as applied in or to a lithographic process, wherein the relation is determined by calculating the field to field effects when moving between fields on the substrates from which measurement data is obtained.

21. A computer program comprising computer readable instructions which, when run on suitable computer apparatus, cause the computer apparatus to perform the method of any one of the preceding clauses.

22. A computer program product comprising the computer program of clause 21.

23. An apparatus having a processor specifically adapted to carry out the steps of the method as claused in any one of clauses 1 to 20.

24. An apparatus according to clause 23 which is specifically configured as a lithographic apparatus operable to perform a lithographic process on substrates.

Figure 3:
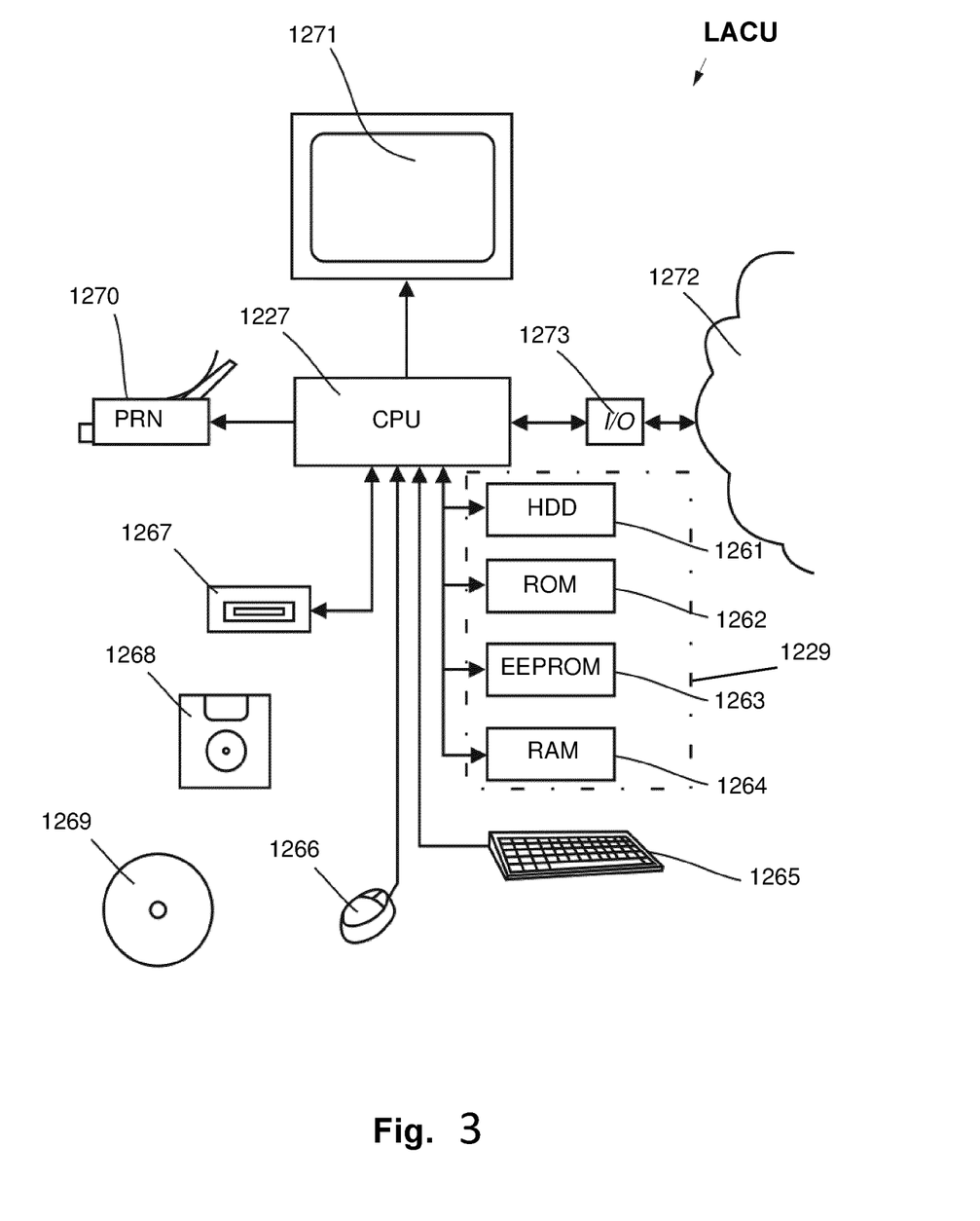
FIG. 3 illustrates computer system hardware useful in implementing the processes disclosed herein.

The steps of the methods described above can be automated within the lithography apparatus control unit LACU shown in FIG. 1. This unit LACU may include a computer assembly as shown in FIG. 3. The computer assembly may be a dedicated computer in the form of a control unit in embodiments of the assembly according to the invention or, alternatively, be a central computer controlling the lithographic projection apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 1229 connected to processor 1227 may comprise a number of memory components like a hard disk 1261, Read Only Memory (ROM) 1262, Electrically Erasable Programmable Read Only Memory (EEPROM) 1263 and Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse 1266. A touch screen, track ball, speech converter or other interfaces that are known to persons skilled in the art may also be used.

The processor 1227 may be connected to a reading unit 1267, which is arranged to read data, e.g. in the form of computer executable code, from and under some circumstances store data on a data carrier, like a floppy disc 1268 or a CDROM 1269. Also DVD's or other data carriers known to persons skilled in the art may be used.

The processor 1227 may also be connected to a printer 1270 to print out output data on paper as well as to a display 1271, for instance a monitor or LCD (Liquid Crystal Display), of any other type of display known to a person skilled in the art.

The processor 1227 may be connected to a communications network 1272, for instance a public switched telephone network (PSTN), a local area network (LAN), a wide area network (WAN) etc. by means of transmitters/receivers 1273 responsible for input/output (I/O). The processor 1227 may be arranged to communicate with other communication systems via the communications network 1272. In an embodiment of the invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272. Connections between modules can be made wired or wireless.

The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "field"/"die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. In addition, it should be appreciated that structural features or method steps shown or described in any one embodiment herein can be used in other embodiments as well.

The invention claimed is:

1. A method of determining a set of metrology point locations, the set comprising a subset of potential metrology point locations on a substrate, the method comprising:
determining, by a hardware computer system, a relation between noise distributions associated with a plurality of the potential metrology point locations using existing knowledge; and
using the determined relation and a model associated with the substrate to determine the set.

2. The method according to claim 1, wherein the relation describes covariance between each of the plurality of potential metrology point locations.

3. The method according to claim 2, wherein the relation has the shape of a covariance matrix and the method further comprises, for each of the potential metrology point locations, minimizing the determinant of a matrix which is formed from: a design matrix describing the model with the respective potential metrology point location; and the covariance matrix.

4. The method according to claim 1, wherein the relation includes a relative magnitude of variances associated with the noise distributions.

5. The method according to claim 1, wherein the metrology point locations contained in the set are the metrology point locations which contribute the greatest level of informativity about the substrate for a pre-determined size of the set.

6. The method according to claim 1, further comprising performing a metrology operation on the substrate using measurements obtained exclusively from metrology points located at the set of metrology point locations.

7. The method according to claim 1, further comprising performing an alignment operation on the substrate using measurements obtained exclusively from metrology points located at the set of metrology point locations, during a lithographic process.

8. The method according to claim 7, further comprising performing a patterning operation on the substrate after performing the alignment operation.

9. The method according to claim 1, further comprising modelling distortions in a lithographic process using measurements obtained exclusively from metrology points located at the set of metrology point locations.

10. The method according to claim 1, wherein the existing knowledge includes previous measurements of noise data associated with the metrology point locations.

11. An apparatus having a processor specifically configured to carry out the method according to claim 1.

12. A method of determining a model for fitting measurements, the model comprising a plurality of pre-determined base functions and coefficients associated with each of those base functions, the method comprising:
determining, by a hardware computer system, a relation between noise distributions associated with a plurality of measurement positions using existing knowledge; and
using the determined relation and calculated values of each base function at the measurement positions to determine the coefficients.

13. The method according to claim 12, wherein the relation describes covariance between each of the plurality of measurement positions.

14. The method according to claim 12, wherein the relation includes a relative magnitude of variances associated with the noise distributions.

15. The method according to claim 12, wherein the determining the coefficients uses a least squares approach.

16. The method according to claim 12, wherein the determining the coefficients includes calculating a maximum likelihood estimator of a vector comprising the coefficients.

17. A computer program product comprising a non-transitory computer-readable medium having instructions therein, the instructions, when executed by a computer system, configured to cause the computer system to at least:

determine a relation between noise distributions associated with a plurality of measurement positions using existing knowledge; and use the determined relation and calculated values of each base function of a plurality of pre-determined base functions of a model for fitting measurements at the measurement positions to determine coefficients associated with each of those base functions.

18. An apparatus having a processor specifically configured to carry out the method according to claim 12.

19. A computer program product comprising a non-transitory computer-readable medium having instructions therein, the instructions, when executed by a computer system, configured to cause the computer system to at least:

determine a relation between noise distributions associated with a plurality of potential metrology point locations on a substrate using existing knowledge; and using the determined relation and a model associated with the substrate to determine a set of metrology point locations comprising the potential metrology point locations.

20. The computer program product according to claim 19, wherein the relation describes covariance between each of the plurality of potential metrology point locations.

* * * * *